(12) United States Patent
Chen (10) Patent No.: US 12,326,374 B2
(45) Date of Patent: Jun. 10, 2025

(54) PRESSURE SENSOR AND ELECTRONIC DEVICE

(71) Applicant: VIVO MOBILE COMMUNICATION CO., LTD., Guangdong (CN)

(72) Inventor: Wei Chen, Chang'an Dongguan (CN)

(73) Assignee: VIVO MOBILE COMMUNICATION CO., LTD., Guangdong (CN)

(*) Notice: Subject to any disclaimer, the term of this patent is extended or adjusted under 35 U.S.C. 154(b) by 339 days.

(21) Appl. No.: 18/105,195

(22) Filed: Feb. 2, 2023

(65) Prior Publication Data
US 2023/0184604 A1 Jun. 15, 2023

Related U.S. Application Data

(63) Continuation of application No. PCT/CN2021/110833, filed on Aug. 5, 2021.

(30) Foreign Application Priority Data

Aug. 7, 2020 (CN) .......................... 202010788347.2

(51) Int. Cl.
| | | |
|---|---|---|
| G01L 1/22 | (2006.01) | |
| G01L 1/18 | (2006.01) | |
| G01L 1/26 | (2006.01) | |
| G01L 5/22 | (2006.01) | |
| H05K 1/02 | (2006.01) | |
| H05K 1/18 | (2006.01) | |

(52) U.S. Cl.
CPC .......... *G01L 1/2281* (2013.01); *G01L 1/2262* (2013.01); *G01L 1/2287* (2013.01);
(Continued)

(58) Field of Classification Search
CPC ... G01L 1/2281; G01L 1/2262; G01L 1/2287; G01L 5/22; G01L 1/205; G01L 1/2293;
(Continued)

(56) References Cited

U.S. PATENT DOCUMENTS

| | | |
|---|---|---|
| 3,102,420 A | 9/1963 | Mason |
| 6,098,464 A | 8/2000 | Avisse et al. |

(Continued)

FOREIGN PATENT DOCUMENTS

| | | |
|---|---|---|
| CN | 1203662 A | 12/1998 |
| CN | 204856438 U | 12/2015 |

(Continued)

OTHER PUBLICATIONS

CN Office Action dated Jul. 30, 2021 as received in Application No. 202010788347.2.

(Continued)

*Primary Examiner* — Brandi N Hopkins
(74) *Attorney, Agent, or Firm* — Price Heneveld LLP (57) ABSTRACT

A pressure sensor and an electronic device are disclosed. The pressure sensor includes a flexible printed circuit board (110) and multiple pressure sensitive adhesive resistors. The multiple pressure sensitive adhesive resistors include pressure sensitive adhesive resistors R1, R2, R3, R4, R5, and R6. The flexible printed circuit board (110) includes a first surface (A) and a second surface (B) that are opposite each other. The pressure sensitive adhesive resistors R1, R3, and R5 are disposed on the first surface (A), and the pressure sensitive adhesive resistors R2, R4, and R6 are disposed on the second surface (B). The flexible printed circuit board (110) is provided with a through hole (C) that allows the first surface (A) to communicate with the second surface (B), and the through hole (C) is at least partially covered by the pressure sensitive adhesive resistors R1, R2, R3, and R4.

16 Claims, 2 Drawing Sheets

(52) U.S. Cl.
CPC .............. *G01L 5/22* (2013.01); *H05K 1/0277* (2013.01); *H05K 1/181* (2013.01); *H05K 2201/09545* (2013.01); *H05K 2201/10022* (2013.01); *H05K 2201/10151* (2013.01)

(58) Field of Classification Search
CPC ......... G01L 1/20; G01L 9/0042; G01L 19/04; G01L 27/002; G01L 9/065; H05K 1/0277; H05K 1/181; H05K 2201/09545; H05K 2201/10022; H05K 2201/10151; G01D 5/165; G06F 3/0412; G06F 3/0414
See application file for complete search history.

(56) References Cited

U.S. PATENT DOCUMENTS

2019/0041281 A1    2/2019   Li
2019/0049326 A1*   2/2019   Li ..................... G01L 9/0054
2019/0368952 A1*   12/2019  Li ..................... G06F 3/016

FOREIGN PATENT DOCUMENTS

| | | | | |
|---|---|---|---|---|
| CN | 107797702 | A | 3/2018 | |
| CN | 108235748 | A | 6/2018 | |
| CN | 108603799 | A | 9/2018 | |
| CN | 110823446 | A | 2/2020 | |
| CN | 111426413 | A | 7/2020 | |
| CN | 111998976 | A | 11/2020 | |
| GB | 2 107 876 | A | 5/1983 | |
| JP | H03-249530 | A | 11/1991 | |
| WO | WO-2017133017 | A1 * | 8/2017 | ............... G01L 1/18 |
| WO | 2018/133054 | A1 | 7/2018 | |

OTHER PUBLICATIONS

International Search Report and Written Opinion of the International Searching Authority dated Oct. 28, 2021 as received in Application No. PCT/CN2021/110833.

* cited by examiner

PRESSURE SENSOR AND ELECTRONIC DEVICE

CROSS-REFERENCE TO RELATED APPLICATIONS

The present invention is a continuation application of PCT International Application No. PCT/CN2021/110833 filed on Aug. 5, 2021, which claims priority to Chinese Patent Application No. 202010788347.2, filed with the China National Intellectual Property Administration on Aug. 7, 2020 and entitled "PRESSURE SENSOR AND ELECTRONIC DEVICE". All of the disclosures are incorporated herein by reference in their entireties.

TECHNICAL FIELD

This application relates to the field of sensor technologies, and in particular, to a pressure sensor and an electronic device.

BACKGROUND

With increasing requirements on product appearance, a design of hidden keys is increasingly present on flagship and high-end smartphones. A common design scheme is to use a pressure sensor as a hidden key.

In the design scheme in which a pressure sensor is used as a hidden key, generally pressure sensitive adhesive resistors are used to form a Wheatstone bridge, so as to convert the pressure received into a voltage difference for output. Resistivity of the pressure sensitive adhesive resistor changes with temperature. In a case that a smartphone stays in a high or low temperature environment for a long time, for example, the smartphone has been placed outdoor in the sunlight in summer, or the smartphone has been placed outdoor in a low temperature in winter, after a user picks up the smartphone and presses the hidden key, although the user's finger has been lifted, the pressure sensitive adhesive resistor of the hidden key still generates and outputs a voltage difference due to a temperature effect. As a result, the smartphone considers that the user presses and holds the hidden key without releasing it, which in turn leads to a problem that the smartphone is switched off or does not respond to the user's another press on the hidden key.

In this application, the temperature effect refers to a phenomenon that when a hot or cold housing of a smartphone is touched by a user finger or another thermostatic object, resistivity of pressure sensitive adhesive at different locations changes inconsistently due to different distances between the pressure sensitive adhesive at different locations and the finger.

SUMMARY

According to a first aspect, an embodiment of this application provides a pressure sensor, including a flexible printed circuit board and multiple pressure sensitive adhesive resistors, where the multiple pressure sensitive adhesive resistors include a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6; the flexible printed circuit board includes a first surface and a second surface that are opposite each other; the pressure sensitive adhesive resistor R1, the pressure sensitive adhesive resistor R3, and the pressure sensitive adhesive resistor R5 are disposed on the first surface, and the pressure sensitive adhesive resistor R2, the pressure sensitive adhesive resistor R4, and the pressure sensitive adhesive resistor R6 are disposed on the second surface; the flexible printed circuit board is provided with a through hole that allows the first surface to communicate with the second surface, and the through hole is at least partially covered by the pressure sensitive adhesive resistor R1, the pressure sensitive adhesive resistor R2, the pressure sensitive adhesive resistor R3, and the pressure sensitive adhesive resistor R4; and the pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge.

According to a second aspect, an embodiment of this application provides an electronic device, including the pressure sensor according to the first aspect, where the pressure sensor is fastened inside a device housing as a hidden key.

BRIEF DESCRIPTION OF DRAWINGS

The drawings described herein are intended for a further understanding of this application and constitute a part of this application. Example embodiments of this application and descriptions thereof are intended to explain this application, and do not constitute any inappropriate limitation on this application. In the accompanying drawings.

DESCRIPTION OF EMBODIMENTS

The following clearly describes the technical solutions in the embodiments of this application with reference to the accompanying drawings in the embodiments of this application. Apparently, the described embodiments are some but not all of the embodiments of this application. All other embodiments obtained by a person of ordinary skill in the art based on the embodiments of this application without creative efforts shall fall within the protection scope of this application.

Figure 1:
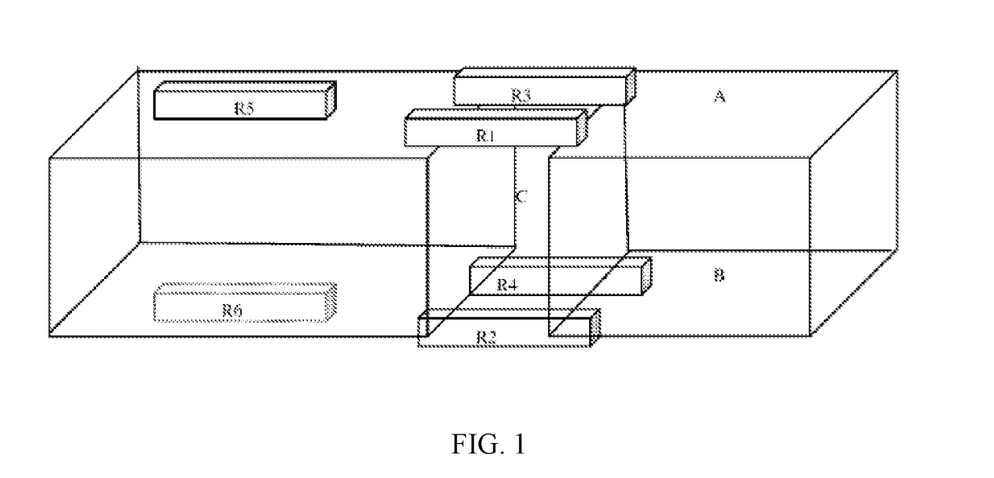
FIG. 1 is a schematic diagram of a composition structure of a pressure sensor according to an embodiment of this application.

FIG. 1 is a schematic diagram of a composition structure of a pressure sensor according to an embodiment of this application. As shown in FIG. 1, the pressure sensor in this embodiment of this application includes a flexible printed circuit board (FPC) 110 and multiple pressure sensitive adhesive resistors. Multiple pressure sensitive adhesive resistors may be printed on the flexible printed circuit board to form a flexible printed circuit assembly (FPCA). The multiple pressure sensitive adhesive resistors include a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6. The flexible printed circuit board 110 includes a first surface A and a second surface B that are opposite each other. The pressure sensitive adhesive resistor R1, the pressure sensitive adhesive resistor R3, and the pressure sensitive adhesive resistor R5 are disposed on the first surface A, and the pressure sensitive adhesive resistor R2, the pressure sensitive adhesive resistor R4, and the pressure sensitive adhesive resistor R6 are disposed on the second surface B. The flexible printed circuit board 110 is further provided with a through hole C that allows the first surface A to communicate with the second surface B, and the through hole C is at least partially covered by the pressure sensitive adhesive resistor R1, the pressure sensitive adhesive resistor R2, the pressure sensitive adhesive resistor R3, and the pressure sensitive adhesive resistor R4. The pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge.

In the pressure sensor provided in this embodiment of this application, multiple pressure sensitive adhesive resistors are disposed on a flexible printed circuit board. The multiple pressure sensitive adhesive resistors include a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6, and the flexible printed circuit board includes a first surface and a second surface that are opposite each other. The pressure sensitive adhesive resistor R1, the pressure sensitive adhesive resistor R3, and the pressure sensitive adhesive resistor R5 are disposed on the first surface, and the pressure sensitive adhesive resistor R2, the pressure sensitive adhesive resistor R4, and the pressure sensitive adhesive resistor R6 are disposed on the second surface. The flexible printed circuit board is further provided with a through hole that allows the first surface to communicate with the second surface, and the through hole is at least partially covered by the pressure sensitive adhesive resistor R1, the pressure sensitive adhesive resistor R2, the pressure sensitive adhesive resistor R3, and the pressure sensitive adhesive resistor R4. The pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge. Voltage signals resulting from the temperature effect on the pressure sensitive adhesive resistor R5 and the pressure sensitive adhesive resistor R6 is used to compensate for voltage signals resulting from the temperature effect on the pressure sensitive adhesive resistor R1, the pressure sensitive adhesive resistor R2, the pressure sensitive adhesive resistor R3, and the pressure sensitive adhesive resistor R4, so that a voltage signal output by the pressure sensor includes only a voltage signal generated by the pressure action, thereby eliminating the impact of temperature on the voltage signal output by the pressure sensor, and implementing temperature compensation for the pressure sensor. This can guarantee measurement accuracy of the pressure sensor in a high or low temperature environment, and resolve problems such as false alarm or release delay of the pressure sensor caused by the temperature effect.

Figure 2:
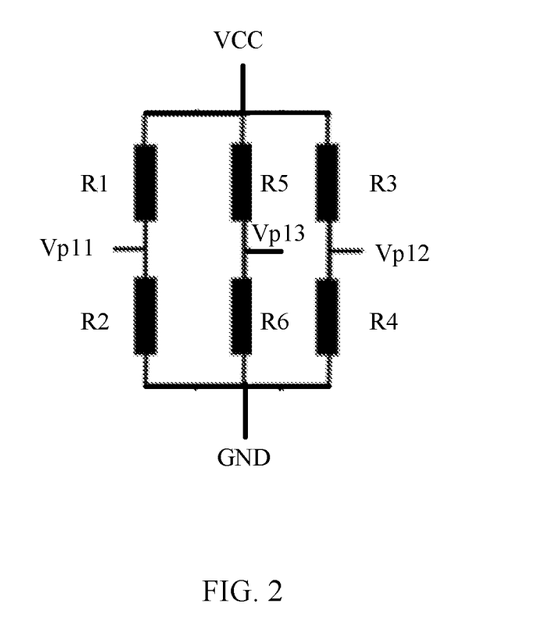
FIG. 2 is a schematic diagram of a working principle of a Wheatstone bridge in a pressure sensor according to an embodiment of this application.
Figure 3:
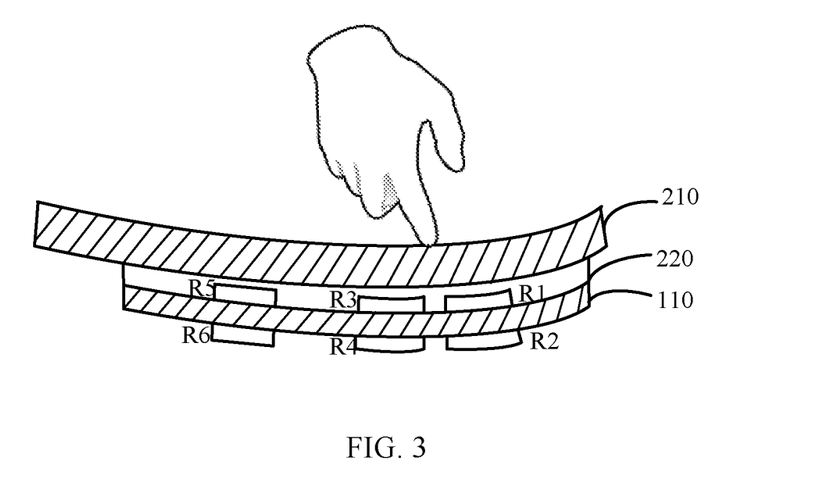
FIG. 3 is a schematic diagram of a pressure action on a pressure sensor according to an embodiment of this application.

The following describes a working principle of the pressure sensor according to the embodiments of this application with reference to FIG. 2 to FIG. 3.

FIG. 2 is a schematic diagram of a working principle of a Wheatstone bridge in a pressure sensor according to an embodiment of this application. As shown in FIG. 2, the pressure sensitive adhesive resistor R1 and the pressure sensitive adhesive resistor R2 are electrically connected, and a first voltage signal Vp11 is generated between the pressure sensitive adhesive resistor R1 and the pressure sensitive adhesive resistor R2. Because the pressure sensitive adhesive resistor R1 and the pressure sensitive adhesive resistor R2 form a bleeder circuit and are connected between a power supply VCC and a ground terminal GND, the first voltage signal Vp11 is a voltage on the pressure sensitive adhesive resistor R2. The pressure sensitive adhesive resistor R3 and the pressure sensitive adhesive resistor R4 are electrically connected, and a second voltage signal Vp12 is generated between the pressure sensitive adhesive resistor R3 and the pressure sensitive adhesive resistor R4. Because the pressure sensitive adhesive resistor R3 and the pressure sensitive adhesive resistor R4 form a bleeder circuit and are connected between the power supply VCC and the ground terminal GND, the second voltage signal Vp12 is a voltage on the pressure sensitive adhesive resistor R4. The pressure sensitive adhesive resistor R5 and the pressure sensitive adhesive resistor R6 are electrically connected, and a third voltage signal Vp13 is generated between the pressure sensitive adhesive resistor R5 and the pressure sensitive adhesive resistor R6. Because the pressure sensitive adhesive resistor R5 and the pressure sensitive adhesive resistor R6 form a bleeder circuit and are connected between the power supply VCC and the ground terminal GND, the third voltage signal Vp13 is a voltage on the pressure sensitive adhesive resistor R6. A signal $\Delta U1$ output by the first Wheatstone bridge is a difference between the first voltage signal Vp11 and the third voltage signal Vp13, that is, $\Delta U1=Vp11-Vp13$. A signal $\Delta U2$ output by the second Wheatstone bridge is a difference between the second voltage signal Vp12 and the third voltage signal Vp13, that is, $\Delta U2=Vp12-Vp13$. A signal $\Delta U$ output by the pressure sensor is a sum of the signal $\Delta U1$ output by the first Wheatstone bridge and the signal $\Delta U2$ output by the second Wheatstone bridge, that is, $\Delta U=\Delta U1+\Delta U2$.

In a case that the pressure sensor in this embodiment of this application is not affected by the pressure action and temperature effect, the first voltage signal Vp11, that is, the voltage on the pressure sensitive adhesive resistor R2, is a voltage generated through voltage division of the pressure sensitive adhesive resistor R1 and the pressure sensitive adhesive resistor R2. The second voltage signal Vp12, that is, the voltage on the pressure sensitive adhesive resistor R4, is a voltage generated through voltage division of the pressure sensitive adhesive resistor R3 and the pressure sensitive adhesive resistor R4. The third voltage signal Vp13, that is, the voltage on the pressure sensitive adhesive resistor R6, is a voltage generated through voltage division of the pressure sensitive adhesive resistor R5 and the pressure sensitive adhesive resistor R6. Because a ratio of the pressure sensitive adhesive resistor R1 to the pressure sensitive adhesive resistor R2, a ratio of the pressure sensitive adhesive resistor R3 to the pressure sensitive adhesive resistor R4, and a ratio of the pressure sensitive adhesive resistor R5 to the pressure sensitive adhesive resistor R6 are equal, voltages generated due to voltage division of the pressure sensitive adhesive resistor R2, the pressure sensitive adhesive resistor R4, and the pressure sensitive adhesive resistor R6 are equal, that is, Vp11=Vp12=Vp13. In this case, the voltage signal output by the first Wheatstone bridge is ΔU1=Vp11−Vp13=0, the voltage signal output by the second Wheatstone bridge is ΔU2=Vp12−Vp13=0, and the voltage signal finally output by the pressure sensor is ΔU=ΔU1+ΔU2=0, so the pressure sensor outputs no signal.

In a case that the pressure sensor in this embodiment of this application is affected by the pressure action but not affected by the temperature effect, the first voltage signal Vp11, that is, the voltage on the pressure sensitive adhesive resistor R2, is a voltage generated through voltage division of the pressure sensitive adhesive resistor R1 and the pressure sensitive adhesive resistor R2; the second voltage signal Vp12, that is, the voltage on the pressure sensitive adhesive resistor R4, is a voltage generated through voltage division of the pressure sensitive adhesive resistor R3 and the pressure sensitive adhesive resistor R4; and the third voltage signal Vp13, that is, the voltage on the pressure sensitive adhesive resistor R6, is a voltage generated through voltage division of the pressure sensitive adhesive resistor R5 and the pressure sensitive adhesive resistor R6. Because the pressure sensitive adhesive resistor R1, the pressure sensitive adhesive resistor R2, the pressure sensitive adhesive resistor R3, and the pressure sensitive adhesive resistor R4 at least partially cover the through hole C, that is, are in a region of the flexible printed circuit board subjected to the action of pressure, a curvature of such region changes under the action of pressure, as shown in FIG. 3. Therefore, as the curvature of the region of the flexible printed circuit board subjected to the action of pressure changes, the pressure sensitive adhesive resistor R1 and the pressure sensitive adhesive resistor R3 are squeezed, and the pressure sensitive adhesive resistor R2 and the pressure sensitive adhesive resistor R4 are stretched, so that resistivities of the pressure sensitive adhesive resistor R1 and the pressure sensitive adhesive resistor R3 decrease, and resistivities of the pressure sensitive adhesive resistor R2 and the pressure sensitive adhesive resistor R4 increase. The pressure sensitive adhesive resistor R1, the pressure sensitive adhesive resistor R2, the pressure sensitive adhesive resistor R3, and the pressure sensitive adhesive resistor R4 are affected by the pressure action, so that a voltage generated due to voltage division of the pressure sensitive adhesive resistor R1 and the pressure sensitive adhesive resistor R3 decreases and a voltage generated due to voltage division of the pressure sensitive adhesive resistor R2 and the pressure sensitive adhesive resistor R4 increases. Because the pressure sensitive adhesive resistor R5 and the pressure sensitive adhesive resistor R6 do not cover the through hole C, that is, are located in a region of the flexible printed circuit board not subjected to the action of pressure, a curvature of such region does not change under the action of pressure, as shown in FIG. 3. Therefore, the pressure sensitive adhesive resistor R5 and the pressure sensitive adhesive resistor R6 are not squeezed or stretched, and resistivities of the pressure sensitive adhesive resistor R5 and the pressure sensitive adhesive resistor R6 do not change. The pressure sensitive adhesive resistor R5 and the pressure sensitive adhesive resistor R6 are free from the action of pressure, and a voltage generated due to voltage division of the pressure sensitive adhesive resistor R5 and pressure sensitive adhesive resistor R6 does not change.

In addition, before being subjected to the action of pressure, both the ratio of the pressure sensitive adhesive resistor R1 to the pressure sensitive adhesive resistor R2 and the ratio of the pressure sensitive adhesive resistor R3 to the pressure sensitive adhesive resistor R4 are equal to the ratio of the pressure sensitive adhesive resistor R5 to the pressure sensitive adhesive resistor R6. Therefore, after being subjected to the action of pressure, the voltages generated due to the voltage division of the pressure sensitive adhesive resistor R2 and pressure sensitive adhesive resistor R4 both are greater than the voltage generated due to the voltage division of the pressure sensitive adhesive resistor R6, that is, Vp11>Vp13, and Vp12>Vp13. In this case, the voltage signal output by the first Wheatstone bridge, ΔU1=Vp11−Vp13>0, is an electrical signal generated due to pressure on the first Wheatstone bridge, the voltage signal output by the second Wheatstone bridge, ΔU2=Vp12−Vp13>0, is an electrical signal generated due to pressure on the second Wheatstone bridge, and the voltage signal finally output by the pressure sensor is ΔU=ΔU1+ΔU2>0. The pressure sensor converts the pressure received into an electrical signal for output.

Figure 4:
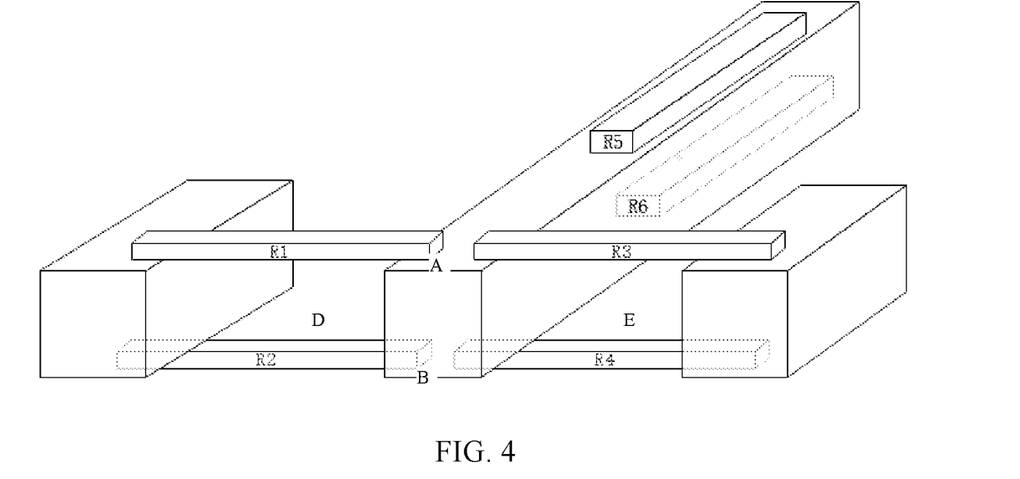
FIG. 4 is a schematic diagram of another composition structure of a pressure sensor according to an embodiment of this application.

In a case that the pressure sensor in this embodiment of this application is affected by the pressure action and the temperature effect, the first voltage signal Vp11, that is, the voltage on the pressure sensitive adhesive resistor R2, is a voltage generated through voltage division of the pressure sensitive adhesive resistor R1 and the pressure sensitive adhesive resistor R2; the second voltage signal Vp12, that is, the voltage on the pressure sensitive adhesive resistor R4, is a voltage generated through voltage division of the pressure sensitive adhesive resistor R3 and the pressure sensitive adhesive resistor R4; and the third voltage signal Vp13, that is, the voltage on the pressure sensitive adhesive resistor R6, is a voltage generated through voltage division of the pressure sensitive adhesive resistor R5 and the pressure sensitive adhesive resistor R6. In a case that the pressure sensor is in a high-temperature environment for a long time, the resistivities of the pressure sensitive adhesive resistor R1, the pressure sensitive adhesive resistor R2, the pressure sensitive adhesive resistor R3, the pressure sensitive adhesive resistor R4, the pressure sensitive adhesive resistor R5, and the pressure sensitive adhesive resistor R6 increase as the ambient temperature rises. When a user finger that has a temperature lower than the ambient temperature presses the pressure sensor, as shown in FIG. 4, because the pressure sensitive adhesive resistor R1, the pressure sensitive adhesive resistor R3, and the pressure sensitive adhesive resistor R5 are closer to the user finger than the pressure sensitive adhesive resistor R2, the pressure sensitive adhesive resistor R4, and the pressure sensitive adhesive resistor R6, temperatures of the pressure sensitive adhesive resistor R1, the pressure sensitive adhesive resistor R3, and the pressure sensitive adhesive resistor R5 are lower than temperatures of the pressure sensitive adhesive resistor R2, the pressure sensitive adhesive resistor R4, and the pressure sensitive adhesive resistor R6, and resistivities of the pressure sensitive adhesive resistor R1, the pressure sensitive adhesive resistor R3, and the pressure sensitive adhesive resistor R5 are lower than resistivities of the pressure sensitive adhesive resistor R2, the pressure sensitive adhesive resistor R4, and the pressure sensitive adhesive resistor R6. The pressure sensitive adhesive resistor R1, the pressure sensitive adhesive resistor R2, the pressure sensitive adhesive resistor R3, the pressure sensitive adhesive resistor R4, the pressure sensitive adhesive resistor R5, and the pressure sensitive adhesive resistor R6 are affected by the temperature effect, so that voltages generated due to voltage division of the pressure sensitive adhesive resistor R1, the pressure sensitive adhesive resistor R3, and the pressure sensitive adhesive resistor R5 decrease, and voltages generated due to the voltage division of the pressure sensitive adhesive resistor R2, the pressure sensitive adhesive resistor R4, and the pressure sensitive adhesive resistor R6 increase.

In addition, a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold. In this case, it may be considered that the temperature of the pressure sensitive adhesive resistor R5 keeps consistent with the temperatures of the pressure sensitive adhesive resistor R1 and the pressure sensitive adhesive resistor R3 under any condition, and the temperature of the pressure sensitive adhesive resistor R6 keeps consistent with the temperatures of the pressure sensitive adhesive resistor R2 and the pressure sensitive adhesive resistor R4 under any condition. Therefore, under the influence of the temperature effect, the decrements of the voltages generated due to the voltage division of the pressure sensitive adhesive resistor R1, the pressure sensitive adhesive resistor R3, and the pressure sensitive adhesive resistor R5 are equal; and increments of the voltages generated due to the voltage division of the pressure sensitive adhesive resistor R2, the pressure sensitive adhesive resistor R4, and the pressure sensitive adhesive resistor R6 are equal. The preset threshold may be determined based on volume or the like of the pressure sensitive adhesive resistor, which is not limited in this embodiment of this application.

In this case, the voltage signal output by the first Wheatstone bridge is $\Delta U1=Vp11-Vp13$. Through the temperature-effect-induced increment of the voltage generated due to the voltage division of the pressure sensitive adhesive resistor R6, the temperature-effect-induced increment of the voltage generated due to the voltage division of the pressure sensitive adhesive resistor R2 is removed, so that $\Delta U1$ includes only the electrical signal generated by the first Wheatstone bridge under pressure. The voltage signal output by the second Wheatstone bridge is $\Delta U2=Vp12-Vp13$. Through the temperature-effect-induced increment of the voltage generated due to the voltage division of the pressure sensitive adhesive resistor R6, the temperature-effect-induced increment of the voltage generated due to the voltage division of the pressure sensitive adhesive resistor R4 is removed, so that $\Delta U2$ includes only the electrical signal generated by the second Wheatstone bridge under pressure. In this way, the voltage signal finally output by the pressure sensor, $\Delta U=\Delta U1+\Delta U2$, is only an electrical signal converted by the pressure sensor from the pressure received.

FIG. 4 is a schematic diagram of another composition structure of a pressure sensor according to an embodiment of this application. As shown in FIG. 4, the pressure sensor in this embodiment of this application includes a flexible printed circuit board 110 and multiple pressure sensitive adhesive resistors. The multiple pressure sensitive adhesive resistors include a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6. The flexible printed circuit board 110 includes a first surface A and a second surface B that are opposite each other. The pressure sensitive adhesive resistor R1, the pressure sensitive adhesive resistor R3, and the pressure sensitive adhesive resistor R5 are disposed on the first surface A, and the pressure sensitive adhesive resistor R2, the pressure sensitive adhesive resistor R4, and the pressure sensitive adhesive resistor R6 are disposed on the second surface B. The flexible printed circuit board 110 is further provided with through holes that allow the first surface A to communicate with the second surface B. The through holes include a first through hole D and a second through hole E. The first through hole D is at least partially covered by the pressure sensitive adhesive resistor R1 and the pressure sensitive adhesive resistor R2, and the second through hole E is at least partially covered by the pressure sensitive adhesive resistor R3 and the pressure sensitive adhesive resistor R4. The pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge. The Wheatstone bridge in the pressure sensor in this embodiment works in the same way as the Wheatstone bridge in the pressure sensor in FIG. 1. Therefore, details are not described herein again.

Based on a same technical concept, an embodiment of this application further provides an electronic device. The electronic device includes the pressure sensor in the foregoing embodiments. The electronic device may be at least one of a mobile phone, a tablet computer, an in-vehicle computer, a wearable device, an intelligent robot, and the like. A type of the electronic device is not limited in this embodiment of this application. As shown in FIG. 3, in the electronic device, the pressure sensor is fastened inside a device housing 210 as a hidden key. In some optional examples, the device housing 210 is a metal housing, and the pressure sensor is fastened inside the device housing 210 by using a double-sided adhesive 220.

In the electronic device according to this embodiment of this application, multiple pressure sensitive adhesive resistors are disposed on a flexible printed circuit board. The multiple pressure sensitive adhesive resistors include a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6, and the flexible printed circuit board includes a first surface and a second surface that are opposite each other. The pressure sensitive adhesive resistor R1, the pressure sensitive adhesive resistor R3, and the pressure sensitive adhesive resistor R5 are disposed on the first surface, and the pressure sensitive adhesive resistor R2, the pressure sensitive adhesive resistor R4, and the pressure sensitive adhesive resistor R6 are disposed on the second surface. The flexible printed circuit board is further provided with a through hole that allows the first surface to communicate with the second surface, and the through hole is at least partially covered by the pressure sensitive adhesive resistor R1, the pressure sensitive adhesive resistor R2, the pressure sensitive adhesive resistor R3, and the pressure sensitive adhesive resistor R4. The pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge. Voltage signals resulting from the temperature effect on the pressure sensitive adhesive resistor R5 and the pressure sensitive adhesive resistor R6 is used to compensate for voltage signals resulting from the temperature effect on the pressure sensitive adhesive resistor R1, the pressure sensitive adhesive resistor R2, the pressure sensitive adhesive resistor R3, and the pressure sensitive adhesive resistor R4, so that a voltage signal output by the pressure sensor includes only the voltage signal generated by the pressure action, thereby eliminating the impact of temperature on the voltage signal output by the pressure sensor, and implementing temperature compensation for the pressure sensor. This can guarantee measurement accuracy of the pressure sensor in a high or low temperature environment, and resolve problems such as false alarm or release delay of the pressure sensor caused by the temperature effect.

It should be noted that, in this specification, the terms "include", "comprise", or any of their variants are intended to cover a non-exclusive inclusion, so that a process, a method, an article, or an apparatus that includes a series of elements not only includes those elements but also includes other elements that are not expressly listed, or further includes elements inherent to such a process, method, article, or apparatus. In absence of more constraints, an element preceded by "includes a . . . " does not preclude the existence of other identical elements in the process, method, article, or apparatus that includes the element.

According to the description of the foregoing implementations, persons skilled in the art can clearly understand that the method in the foregoing embodiments may be implemented by software in addition to a necessary universal hardware platform or by hardware only. In most cases, the former is a more preferred implementation. Based on such an understanding, the technical solutions of this application essentially, or the part contributing to the prior art may be implemented in a form of a software product. The software product is stored in a storage medium (for example, ROM/RAM, a magnetic disk, or an optical disc), and includes several instructions for instructing a terminal (which may be a mobile phone, a computer, a server, an air conditioner, a network device, or the like) to perform the method described in the embodiments of this application.

The embodiments of this application are described above with reference to the accompanying drawings, but this application is not limited to the foregoing implementations. The foregoing implementations are only illustrative rather than restrictive. Inspired by this application, persons of ordinary skill in the art can still derive many variations without departing from the essence of this application and the protection scope of the claims. All these variations shall fall within the protection of this application.

What is claimed is:

1. A pressure sensor, comprising a flexible printed circuit board and multiple pressure sensitive adhesive resistors, wherein the multiple pressure sensitive adhesive resistors comprise a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6;

the flexible printed circuit board comprises a first surface and a second surface that are opposite each other;

the pressure sensitive adhesive resistor R1, the pressure sensitive adhesive resistor R3, and the pressure sensitive adhesive resistor R5 are disposed on the first surface, and the pressure sensitive adhesive resistor R2, the pressure sensitive adhesive resistor R4, and the pressure sensitive adhesive resistor R6 are disposed on the second surface;

the flexible printed circuit board is provided with a through hole that allows the first surface to communicate with the second surface, and the through hole is at least partially covered by the pressure sensitive adhesive resistor R1, the pressure sensitive adhesive resistor R2, the pressure sensitive adhesive resistor R3, and the pressure sensitive adhesive resistor R4; and the pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge.

2. The pressure sensor according to claim 1, wherein a ratio of the pressure sensitive adhesive resistor R1 to the pressure sensitive adhesive resistor R2, a ratio of the pressure sensitive adhesive resistor R3 to the pressure sensitive adhesive resistor R4, and a ratio of the pressure sensitive adhesive resistor R5 to the pressure sensitive adhesive resistor R6 are equal.

3. The pressure sensor according to claim 2, wherein the pressure sensitive adhesive resistor R1 and the pressure sensitive adhesive resistor R2 are electrically connected, and a first voltage signal is generated between the pressure sensitive adhesive resistor R1 and the pressure sensitive adhesive resistor R2;

the pressure sensitive adhesive resistor R3 and the pressure sensitive adhesive resistor R4 are electrically connected, and a second voltage signal is generated between the pressure sensitive adhesive resistor R3 and the pressure sensitive adhesive resistor R4;

the pressure sensitive adhesive resistor R5 and the pressure sensitive adhesive resistor R6 are electrically connected, and a third voltage signal is generated between the pressure sensitive adhesive resistor R5 and the pressure sensitive adhesive resistor R6; and a signal output by the first Wheatstone bridge is a difference between the first voltage signal and the third voltage signal; a signal output by the second Wheatstone bridge is a difference between the second voltage signal and the third voltage signal; and a signal output by the pressure sensor is a sum of the signal output by the first Wheatstone bridge and the signal output by the second Wheatstone bridge.

4. The pressure sensor according to claim 3, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

5. The pressure sensor according to claim 2, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

6. The pressure sensor according to claim 1, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

7. The pressure sensor according to claim 6, wherein the through hole comprises a first through hole and a second through hole, the first through hole is at least partially covered by the pressure sensitive adhesive resistor R1 and the pressure sensitive adhesive resistor R2, and the second through hole is at least partially covered by the pressure sensitive adhesive resistor R3 and the pressure sensitive adhesive resistor R4.

8. An electronic device, comprising a pressure sensor, wherein the pressure sensor is fastened inside a device housing as a hidden key,
wherein the pressure sensor comprises a flexible printed circuit board and multiple pressure sensitive adhesive resistors, wherein the multiple pressure sensitive adhesive resistors comprise a pressure sensitive adhesive resistor R1, a pressure sensitive adhesive resistor R2, a pressure sensitive adhesive resistor R3, a pressure sensitive adhesive resistor R4, a pressure sensitive adhesive resistor R5, and a pressure sensitive adhesive resistor R6;
the flexible printed circuit board comprises a first surface and a second surface that are opposite each other;
the pressure sensitive adhesive resistor R1, the pressure sensitive adhesive resistor R3, and the pressure sensitive adhesive resistor R5 are disposed on the first surface, and the pressure sensitive adhesive resistor R2, the pressure sensitive adhesive resistor R4, and the pressure sensitive adhesive resistor R6 are disposed on the second surface;
the flexible printed circuit board is provided with a through hole that allows the first surface to communicate with the second surface, and the through hole is at least partially covered by the pressure sensitive adhesive resistor R1, the pressure sensitive adhesive resistor R2, the pressure sensitive adhesive resistor R3, and the pressure sensitive adhesive resistor R4; and
the pressure sensitive adhesive resistor R1, the pressure sensitive adhesive resistor R2, the pressure sensitive adhesive resistor R5, and the pressure sensitive adhesive resistor R6 are electrically connected to form a first Wheatstone bridge, and the pressure sensitive adhesive resistor R3, the pressure sensitive adhesive resistor R4, the pressure sensitive adhesive resistor R5, and the pressure sensitive adhesive resistor R6 are electrically connected to form a second Wheatstone bridge.

9. The electronic device according to claim 8, wherein a ratio of the pressure sensitive adhesive resistor R1 to the pressure sensitive adhesive resistor R2, a ratio of the pressure sensitive adhesive resistor R3 to the pressure sensitive adhesive resistor R4, and a ratio of the pressure sensitive adhesive resistor R5 to the pressure sensitive adhesive resistor R6 are equal.

10. The electronic device according to claim 9, wherein the pressure sensitive adhesive resistor R1 and the pressure sensitive adhesive resistor R2 are electrically connected, and a first voltage signal is generated between the pressure sensitive adhesive resistor R1 and the pressure sensitive adhesive resistor R2;
the pressure sensitive adhesive resistor R3 and the pressure sensitive adhesive resistor R4 are electrically connected, and a second voltage signal is generated between the pressure sensitive adhesive resistor R3 and the pressure sensitive adhesive resistor R4;
the pressure sensitive adhesive resistor R5 and the pressure sensitive adhesive resistor R6 are electrically connected, and a third voltage signal is generated between the pressure sensitive adhesive resistor R5 and the pressure sensitive adhesive resistor R6; and
a signal output by the first Wheatstone bridge is a difference between the first voltage signal and the third voltage signal; a signal output by the second Wheatstone bridge is a difference between the second voltage signal and the third voltage signal; and a signal output by the pressure sensor is a sum of the signal output by the first Wheatstone bridge and the signal output by the second Wheatstone bridge.

11. The electronic device according to claim 10, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

12. The electronic device according to claim 9, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

13. The electronic device according to claim 8, wherein a distance between the pressure sensitive adhesive resistor R5 and the pressure sensitive adhesive resistor R1 and a distance between the pressure sensitive adhesive resistor R5 and the pressure sensitive adhesive resistor R3 are less than a preset threshold, so that temperature of the pressure sensitive adhesive resistor R5 is consistent with temperature of the pressure sensitive adhesive resistor R1 and temperature of the pressure sensitive adhesive resistor R3; and a distance between the pressure sensitive adhesive resistor R6 and the pressure sensitive adhesive resistor R2 and a distance between the pressure sensitive adhesive resistor R6 and the pressure sensitive adhesive resistor R4 are less than the preset threshold, so that temperature of the pressure sensitive adhesive resistor R6 is consistent with temperature of the pressure sensitive adhesive resistor R2 and temperature of the pressure sensitive adhesive resistor R4.

14. The electronic device according to claim 13, wherein the through hole comprises a first through hole and a second through hole, the first through hole is at least partially covered by the pressure sensitive adhesive resistor R1 and the pressure sensitive adhesive resistor R2, and the second through hole is at least partially covered by the pressure sensitive adhesive resistor R3 and the pressure sensitive adhesive resistor R4.

15. The electronic device according to claim 8, wherein the device housing is a metal housing, and the pressure sensor is fastened inside the device housing by using a double-sided adhesive.

16. The electronic device according to claim 15, wherein the electronic device comprises at least one of the following: a mobile phone, a tablet computer, an in-vehicle computer, a wearable device, and an intelligent robot.

* * * * *